United States Patent [19]
Pearson et al.

[11] 4,288,259
[45] Sep. 8, 1981

[54] TANTALUM MODIFIED GAMMA PRIME-ALPHA EUTECTIC ALLOY

[75] Inventors: David D. Pearson, West Hartford; Franklin D. Lemkey, Glastonbury, both of Conn.

[73] Assignee: United Technologies Corporation, Hartford, Conn.

[21] Appl. No.: 966,416

[22] Filed: Dec. 4, 1978

[51] Int. Cl.³ .............................................. C22C 19/03
[52] U.S. Cl. ...................................... 148/32; 75/170; 148/32.5
[58] Field of Search ................... 178/170; 148/32, 32.5

[56] References Cited

U.S. PATENT DOCUMENTS

| | | | |
|---|---|---|---|
| 2,542,962 | 2/1951 | Kinsey | 75/170 |
| 3,124,452 | 3/1964 | Kraft | 75/135 |
| 3,554,817 | 1/1971 | Thompson | 75/170 |
| 3,564,940 | 2/1971 | Thompson | 75/170 |
| 3,617,397 | 11/1971 | Maxwell | 75/170 |
| 3,671,223 | 6/1972 | Thompson | 148/32 |
| 3,793,010 | 2/1974 | Lemkey et al. | 75/170 |
| 3,904,403 | 9/1975 | Komatsu et al. | 75/170 |
| 4,012,241 | 3/1977 | Lemkey | 75/170 |
| 4,111,723 | 9/1978 | Lemkey | 75/170 |

OTHER PUBLICATIONS

Kinsey et al., ASM Transactions, vol. 43, pp. 193-225, 1951.
The Form of the Equilibrium Diagrams of Ni-NiAl-Mo Alloys, Academy of Sciences USSR, 132, May-Jun. 1960, pp. 491-495.

*Primary Examiner*—R. Dean
*Attorney, Agent, or Firm*—Charles E. Sohl

[57] ABSTRACT

This disclosure relates to directionally solidified articles produced from a eutectic alloy in the nickel-aluminum-molybdenum system with tantalum added. The articles have a microstructure consisting of a ductile matrix phase of gamma prime containing a fibrous reinforcing second phase of alpha Mo. The nominal composition of the base alloy is 6.9 weight percent aluminum, 15.2 weight percent tantalum, 18.5 weight percent molybdenum, balance nickel. The directionally solidified alloy articles of the invention are characterized by exceptional mechanical properties combined with good oxidation resistance and reasonable sulfidation resistance at elevated temperatures.

7 Claims, 5 Drawing Figures

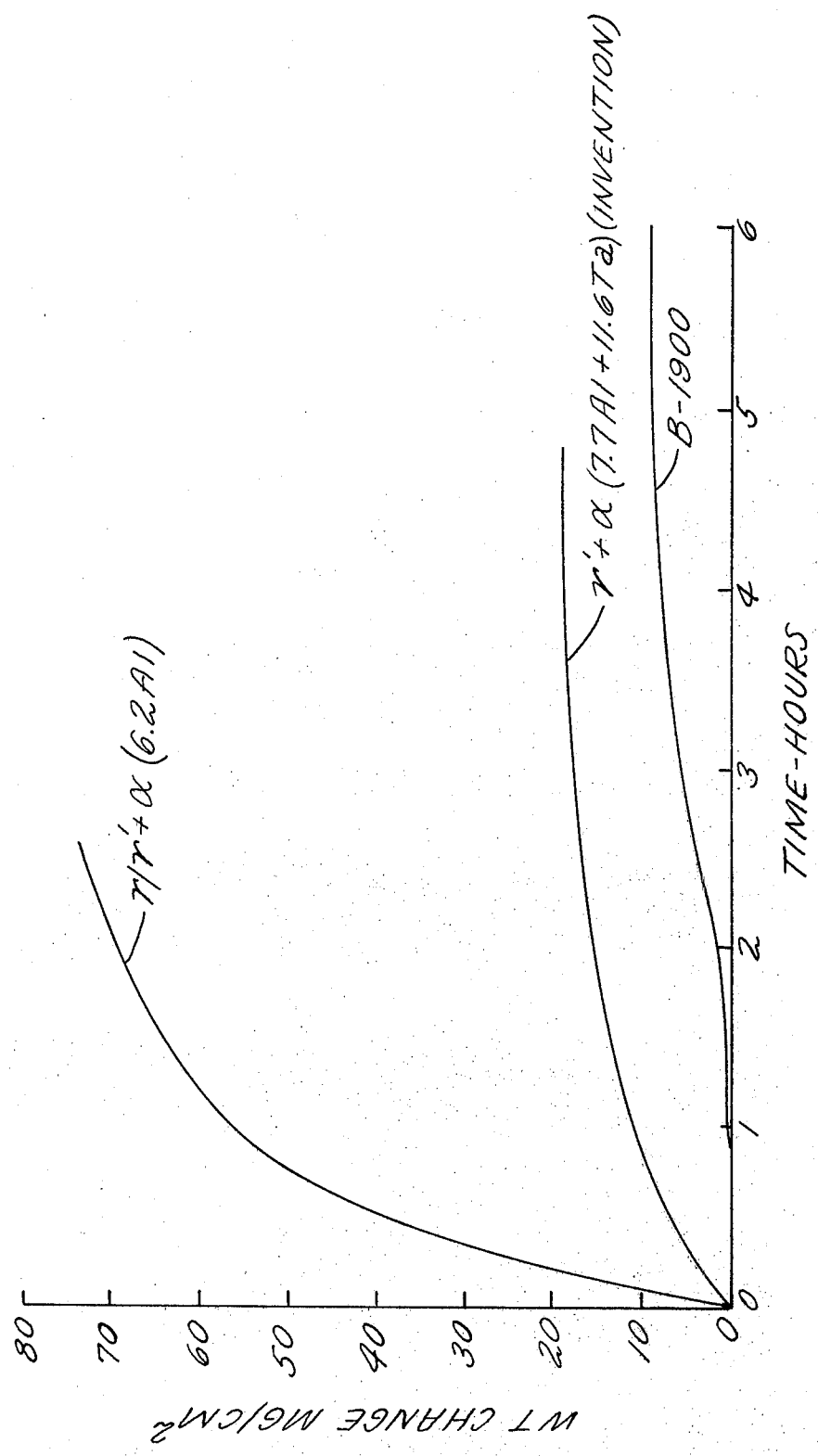

4,288,259

TANTALUM MODIFIED GAMMA PRIME-ALPHA EUTECTIC ALLOY

BACKGROUND OF THE INVENTION

The invention herein described was made in the course of or under a contract or subcontract with the Department of the Navy.

1. Field of the Invention

This invention relates to the field of nickel base superalloy articles used where high mechanical stresses are encountered at high temperatures. This invention is also related to the field of directionally solidified eutectics wherein an alloy of approximately eutectic composition may be directionally solidified so as to produce an aligned multiphase microstructure having anisotropic mechanical properties. The article of the present invention is comprised of a directionally solidified nickel base superalloy of approximately gamma prime-alpha (Mo) eutectic composition having exceptional mechanical properties combined with adequate oxidation and sulfidation resistance at elevated temperatures.

2. Description of the Prior Art

U.S. Pat. No. 2,542,962 to Kinsey describes a broad range of compositions in the aluminum, molybdenum, nickel system without mentioning eutectic compositions or directional solidification. It is now known that certain eutectic alloys respond to proper directional solidification conditions to produce useful second phase aligned microstructures as described in the patent to Kraft, U.S. Pat. No. 3,124,452. In a patent to Thompson, U.S. Pat. No. 3,554,817, there is described a promising pseudo binary eutectic alloy occurring between the inter-metallic compounds $Ni_3Al$ and $Ni_3Cb$ which responds to plane front solidification to produce a casting characterized by an aligned lamellar microstructure. As so solidified, this combination provides one of the strongest nickel base alloys known although its ductility is limited.

In a prior patent to Thompson and Lemkey, U.S. Pat. No. 3,564,940, there is described a class of compositions which solidify according to the monovariant eutectic reaction providing aligned polyphase structures including such systems as the ternary alloys identified as cobalt-chromium-carbon and nickel-aluminum-chromium. The advantage of compositions of this nature is that the desired microstructure can be achieved over a range of compositions in a given system. This provides a substantial increase in the freedom of selection of compositions permitting increased optimization of properties. In U.S. Pat. No. 3,671,223, the concept has been further developed to include those systems which solidify according to the multivariant eutectic reaction where two or more solid phases (N) crystallize simultaneously from the liquid consisting of (N+2) or more components.

U.S. Pat. No. 3,617,397 to Maxwell, assigned to the present assignee discloses a nickel base superalloy which contains 8 percent aluminum and 18 percent molybdenum. This alloy is far from the eutectic point, and the patent does not disclose the benefits available in the directionally solidified eutectic.

U.S. Pat. No. 3,793,010 to Lemkey and Thompson discloses a eutectic article which consists of a gamma-gamma prime matrix with an aligned delta second phase.

U.S. Pat. No. 4,012,241 to Lemeky discloses a monovariant eutectic which is related to the present invention. The nominal composition of this eutectic is 8% aluminum, 27% molybdenum, balance essentially nickel. This composition is preferably directionally solidified to produce a microstructure consisting of a gamma prime matrix containing aligned fibers of alpha molybdenum and preferably small precipitate particles of the gamma phase in the matrix.

U.S. Pat. No. 4,111,723 to Lemkey, assigned to the present assignee, discloses another extended monovariant eutectic based on the nickel-aluminum-molybdenum system. The nominal composition of this alloy is 4.6% aluminum, 35.8% molybdenum, balance essentially nickel. Upon directional solidification, microstructure will consist of a gamma matrix containing aligned alpha molybdenum fibers and preferably also containing precipitate particles of the gamma prime phase in the matrix.

U.S. Pat. No. 3,904,403 discloses a composition in the nickel-aluminum-molybdenum system and suggests the possibility of directional solidification. Additions of up to 3 atomic percent tantalum are suggested.

The most accurate previous work on the nickel-aluminum-molybdenum alloys is described in "The Form of the Equilibrium Diagrams of Ni-NiAl-Mo Alloys," Academy of Sciences USSR, 132, May-June 1960, pp. 491–495, however, this reference does not discuss the eutectic reaction relied upon in the present invention.

The technical article entitled "Nickel-Aluminum-Molybdenum Alloys for Service at Elevated Temperatures," found in ASM Transactions, Vol. 43, pp. 193–225 (1951) by Kinsey and Stewart, describes work connected with the previously mentioned U.S. Pat. No. 2,542,962.

SUMMARY OF THE INVENTION

The present invention includes a nickel base superalloy of gamma prime-alpha eutectic composition with a nominal composition of 6.9 weight percent aluminum, 15.2 weight percent tantalum, 18.5 weight percent molybdenum, balance essentially nickel which is directionally solidified to produce useful articles. This alloy may be cast and directionally solidified to produce a microstructure having a gamma prime [$Ni_3(Al,Ta)$] matrix and an alpha body centered cubic (Mo) second phase in fibrous form. A directionally solidified article of the nominal composition will contain approximately 17 volume percent of the reinforcing second phase. Other elements chosen from the group consisting of columbium, titanium, vanadium, tungsten, yttrium, hafnium, carbon and boron may be incorporated into the alloy.

The directionally solidified article is characterized by room temperature high ductility. Since both the matrix and reinforcing second phase have a significant amount of ductility, thermal fatigue damage which has been a problem in prior eutectic alloy systems is minimized in the invention articles by internal stress relief by plastic deformation. The reduced volume fraction of fibers present, compared with similar prior art eutectic alloys, also contributes to reduced susceptibility to thermal fatigue. Most directionally solidified eutectics heretofore known in the art have been characterized by low ductilities, and particularly low transverse ductilities. The directionally solidified alloy and article of the present invention have longitudinal ductilities comparable to conventional nickel superalloys.

The foregoing, and other objects, features and advantages of the present invention will become apparent in light of the following detailed description of the preferred embodiment thereof as shown in the accompanying drawings.

In the following description of the preferred embodiments, the term "fibrous" will be used to mean both rodlike and platelike morphologies. All percent figures are weight percent unless otherwise specified.

BRIEF DESCRIPTION OF THE DRAWINGS

FIG. 4 shows the sulfidation behavior of the invention alloys.

DESCRIPTION OF THE PREFERRED EMBODIMENTS

Figure 1:
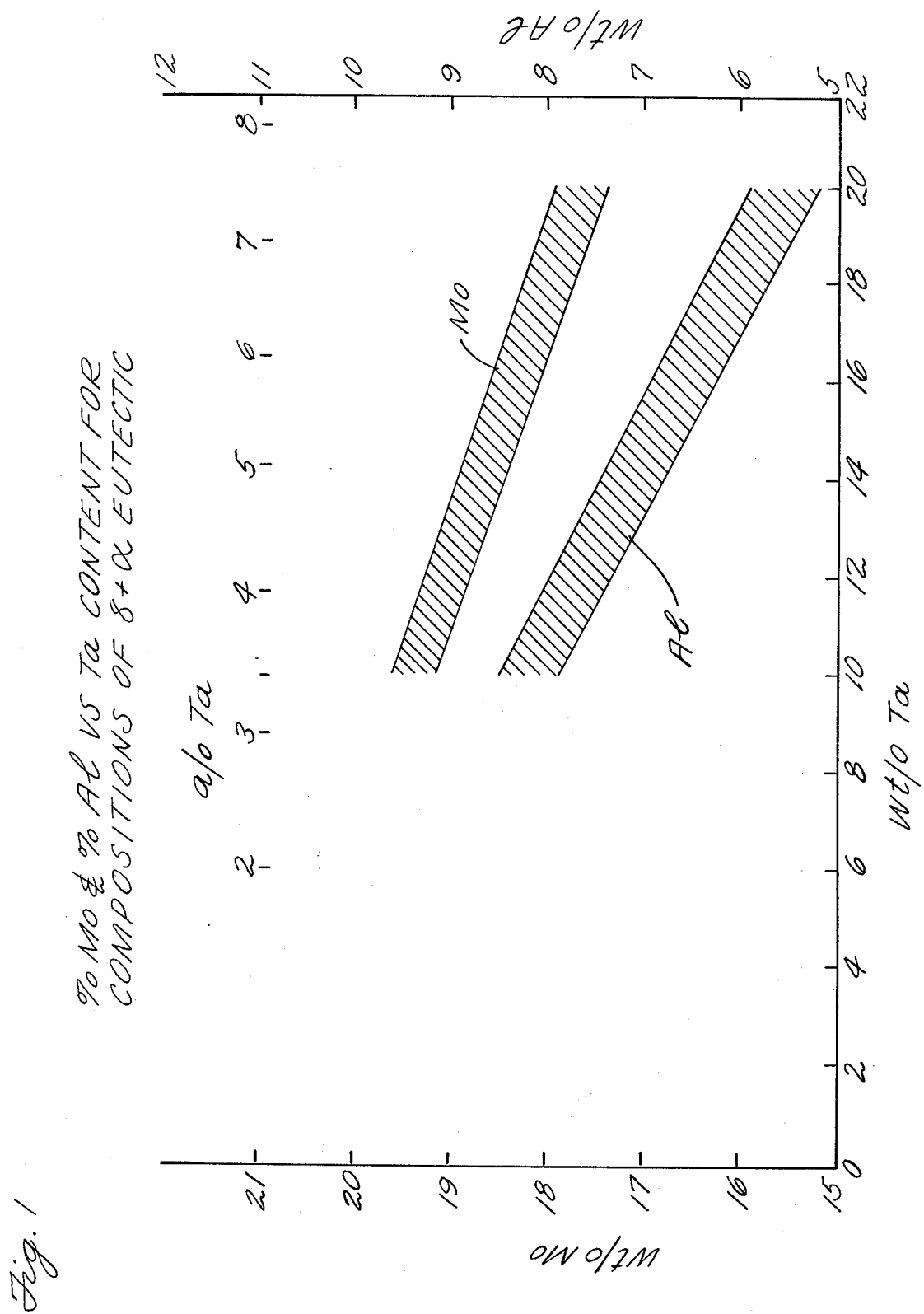
FIG. 1 shows the relationship between the aluminum-molybdenum-tantalum contents of the present invention.

The eutectic alloy of the present invention has restricted composition limits. The most precise definition of the composition limits is given by the following equation which is presented in terms of atomic percent.

$$12.5 \pm 0.5\% \text{ Mo} + [(22.0 \pm 0.5) - X]\% \text{ Al} + X\% \text{ Ta, balance nickel.}$$

In this equation, X (the Ta content) varies between 3.4 and 7.5 and preferably between 4.1 and 7.5 As previously noted, the solidified microstructure of the present invention consists of Mo fibers in a gamma prime matrix. The pure gamma prime phase is an intermetallic compound of the composition $Ni_3Al$. The Ta additions in the present alloy substitute for the Al on an atomic basis. The nominal Al+Ta content is 22 atom percent. Ta additions of 3.4, 4.1 and 7.5 atomic percent, therefore, represent substitutions (on an atomic basis) of Ta for 15.5%, 18.6% and 34% respectively for aluminum which would normally be found in the gamma prime phase. Thus, the microstructure of the present invention comprises Mo fibers in a gamma prime matrix wherein from at least 15.5% and preferably 18.6% to 34% of the nominal aluminum content has been replaced by Ta on an equiatomic basis.

If the molybdenum content is increased beyond the limits set forth in the equation, primary alpha molybdenum-dendrites form during solidification. If the molybdenum content is much less than that set forth in the equation, primary gamma prime dendrites will form. Both of these primary phases adversely affect the mechanical properties.

The nominal composition given by the preceding equation is 12.5 weight percent Mo, 5.45 weight percent Ta, 16.55 weight percent Al, balance nickel, the nominal composition of the preferred range is 12.5 weight percent Mo, 5.8 weight percent Ta, 16.2 weight percent Al, balance nickel. In weight percent, then two nominal compositions are 6.9 weight percent Al, 18.5 weight percent Mo, 15.2 weight percent Ta, balance essentially nickel and 18.4 weight percent Mo, 6.7 weight percent Al, 16.1 weight percent Ta, balance nickel respectively.

Alloys within the ranges previously described can be directionally solidified to produce aligned structures consisting of a gamma prime matrix containing alpha molybdenum fibers. In distinction to the structure described in U.S. Pat. No. 4,012,241, the matrix will be pure gamma prime with no gamma particles and the volume fraction of the molybdenum fibers will be about 17% eg. 15%-18% in contrast to the volume fraction of fibers in the prior art of at least 20%.

It is now well-known that certain eutectic compositions may be directionally solidified to produce an aligned microstructure. The solidification conditions employed are critical to achieving the desired aligned microstructure. These conditions may be summarized in terms of G, the thermal gradient at the liquid-solid interface and R, the solidification rate or the rate of motion of the liquid-solid interface. In particular, for every eutectic alloy, there is a minimum value of G/R which must be exceeded to obtain an aligned microstructure. For the alloys in question, satisfactory microstructures have been obtained for values of G/R as low as 550° F./hr/in². It is believed that G/R values in excess of about 400° F./hr/in² will be satisfactory for the production of aligned microstructures by coupled growth. The experimental results described in this application were obtained on material processed under conditions of G/R of about 2000° F./hr/in². It is also known that the size of the second phase varies with R. For the alloys of the present invention, solidification rates of 2 centimeters per hour produce fibers whose diameter is about 0.6 microns and which are spaced about 1.6 microns from each other.

Upon solidification of the alloy, the liquid material will transform directly to the gamma prime plus alpha molybdenum structure. It was previously thought that this reaction occurred in the alloy described in U.S. Pat. No. 4,012,241. However, it has now been determined that in the compositions described in this prior patent the beta phase is formed on a temporary basis at elevated temperatures and this beta phase subsequently transforms with gamma to form gamma prime plus alpha phases when the temperature is reduced. Elimination of the beta phase improves the high temperature mechanical properties of the present alloy. The beta phase elimination is accomplished by the addition of controlled amounts of tantalum to the alloy as a substitution on an atomic basis for aluminum. Favorable mechanical properties are obtained with tantalum contents in excess of about 10 weight percent (about 3.4 atomic percent) and preferably in excess of 12 weight percent (about 4.1 atomic percent). An upper Ta level of about 20 weight percent is set primarily on basis that higher tantalum levels result in alloys with unacceptably high densities.

FIG. 1 is a graphical presentation of the equation previously described. FIG. 1 shows how the aluminum-molybdenum-tantalum contents are interrelated. The lower horizontal axis has a scale corresponding to the weight percent of tantalum in the alloy. The upper horizontal scale shows the atomic percent of tantalum present. The lefthand horizontal scale shows the molybdenum content in weight percent and the righthand horizontal scale shows the weight percent of aluminum present.

Thus, for example, an alloy containing 16 weight percent tantalum could contain from about 6.25 to about 7 weight percent aluminum and from about 18.1 to about 18.65 weight percent molybdenum. Used in a different fashion, the chart indicates that an alloy containing about 7 weight percent aluminum should contain between about 12.7 and about 16 weight percent tantalum and from about 18.1 to about 18.95 weight percent molybdenum.

A particularly preferred composition having very good rupture properties contains 18.2 weight percent molybdenum, 6.8 weight percent aluminum, 16.6 weight percent tantalum, balance nickel. This alloy upon directional solidification contains about 17 volume percent of molybdenum fibers and has a density of about 8.95 g/cc. This density is somewhat in excess of the density of the commonly used nickel base superalloys. A widely used commercial alloy is known as MAR-M-200+Hf which has a nominal composition of 9% Cr, 10% Co, 5% Al, 2% Ti, 12.5% W, 1% Cb, 2% Hf, 11% C, 0.015% B, balance nickel has a density of about 8.6 g/cc. It is anticipated that the density of the invention alloy could be decreased by substituting a material selected from the group consisting of titanium, columbium and vanadium from up to about half the tantalum content on an atomic basis. The composition of this preferred alloy, with a substitution of titanium for half the tantalum, is 62.1 Ni, 19.5 Mo, 7.2 Al, 8.8 Ta, 2.3 Ti and the composition of an alloy having a substitution of columbium for half of the tantalum would be about 60.8 Ni, 19.1 Mo, 7 Al, 8.6 Ta, 4.4 Cb. The approximate density of these alloys would be about 8.4 g/cc and 8.5 g/cc respectively. In like manner, up to about 10% of the Mo may be replaced on an equiatomic basis by W although this will adversely affect the density. Up to about 25% of the nickel may be replaced by an equiatomic amount of Co with virtually no effect on density.

The longitudinal properties of polycrystalline articles fabricated from the invention alloy is extremely high. However, the transverse properties of the alloy are low as a consequence of grain boundaries. There are two solutions to this problem.

The first is a compositional modification involving the addition of one or more materials selected from the group consisting of up to 2 percent halfnium, up to 0.5 percent zirconium, up to 0.1 percent carbon and up to 0.1 percent boron. These elements are chemically active and tend to tie up the impurities which would normally segregate the high angle grain boundaries.

The second solution is to prepare the articles in the form of single crystals which are free from internal high angle grain boundaries. The term "high angle grain boundaries" refers to those boundaries which separate grains which are misoriented by more than about 2° F.

Figure 2:
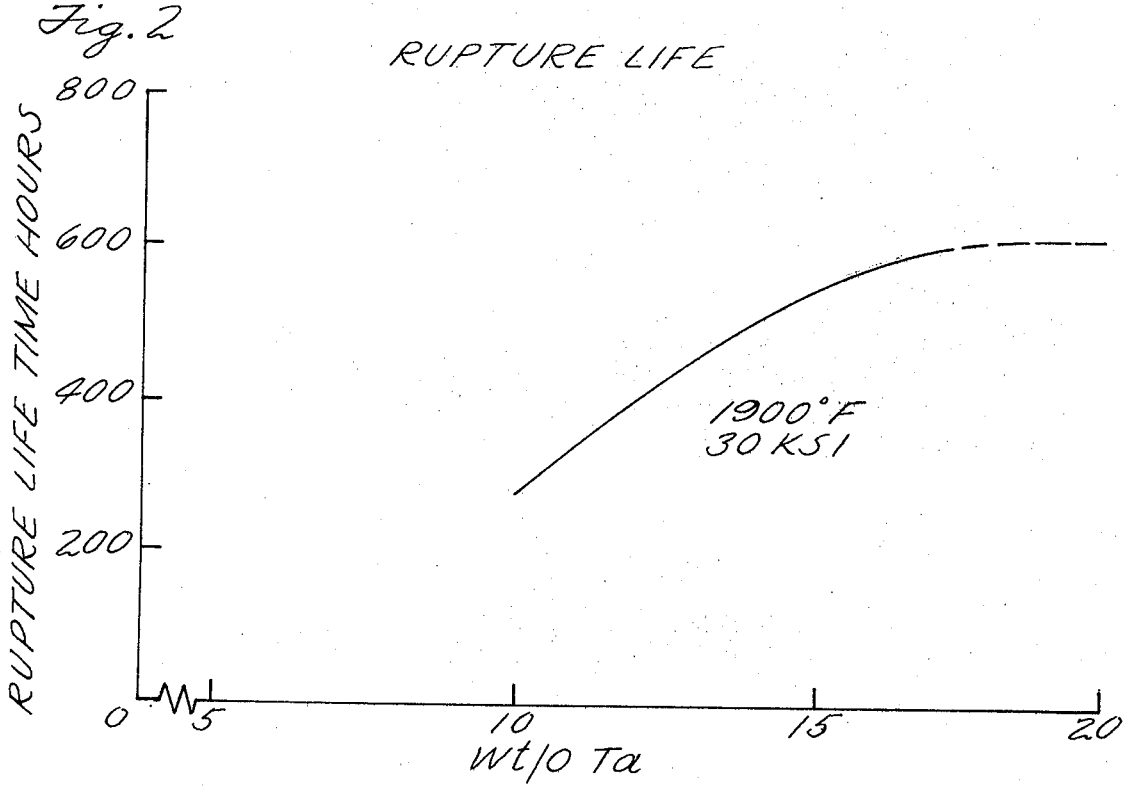
FIG. 2 shows the rupture life of the alloys of the invention as a function of tantalum content.

The effect of tantalum content on the stress rupture life of the alloy tested at 1900° F. and 30 ksi load are shown in FIG. 2. An alloy having a composition of 21 percent molybdenum, 9 percent aluminum and 6 percent tantalum (this alloy obeys the composition equation but contains only 2 atomic percent tantalum) had an average rupture life of about five hours. An alloy having a composition of 18.3 percent molybdenum, 6.8 percent aluminum, 16.6 percent tantalum, balance nickel, had an average rupture life in excess of 500 hours an improvement by a factor of almost 100 over the low tantalum alloy.

Figure 3:
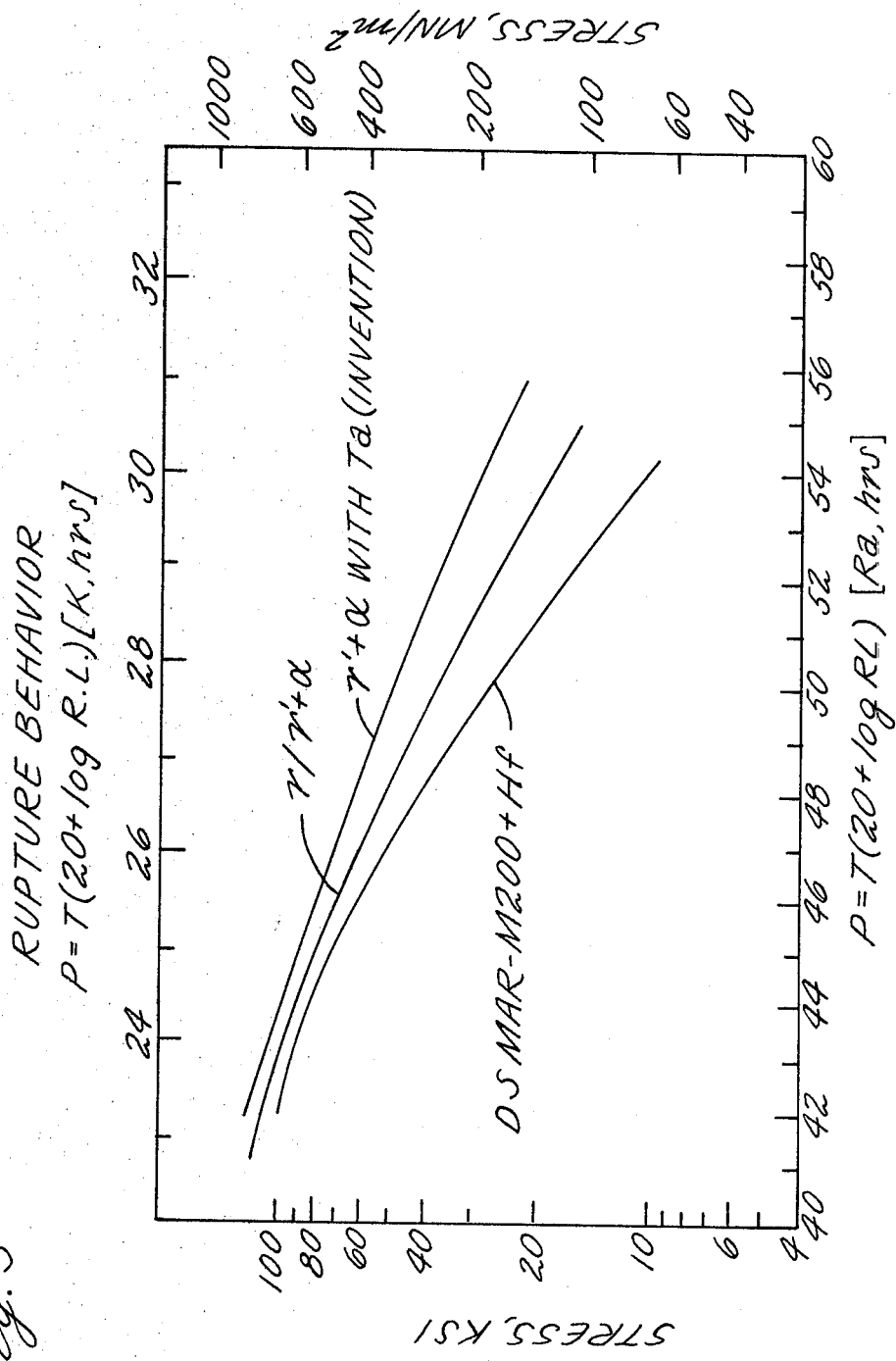
FIG. 3 shows the stress rupture of behavior of the alloys of the invention.

FIG. 3 shows the stress rupture life invention in the form of a Larson Miller parameter curve for the invention alloy, alloys described in U.S. Pat. Nos. 4,012,241 and 4,111,723 compared with MAR-M-200+Hf (previously described).

All of these curves show longitudinal properties for directionally solidified material. It can be seen that the present invention alloy article represents an improvement over the prior art eutectics and the improvement over the prior art eutectics is approximately the same as the improvement of the prior art eutectic over the conventional superalloys.

A further benefit provided by tantalum additions is reduced hot corrosion. FIG. 4 shows the weight gain of various alloys in hot corrosion tests in which specimens were coated with 0.5 mg/cm$^2$ Na$_2$So$_4$ and tested in air 900° C. The chart shows the weight change as a function of time. Increasing weight indicates that corrosion is occurring accompanied by the formation of corrosion products. FIG. 4 also contains a curve showing the sulfidation resistance of alloy B1900, a commercially used superalloy which is moderately susceptible to sulfidation attack. The nominal composition of B1900 is 8% Cr, 10% Co, 6% Mo, 1% Ti, 6% Al, 4.3% Ta, 0.1% C, 0.015% B, 0.08% Zr. This chart shows that increasing the tantalum content decreases the sulfidation attack and that a tantalum content of about 11.6% reduced the sulfidation attack to a rate about twice that of a commercially superalloy. It is anticipated that alloys containing 16% tantalum would display even better resistance to sulfidation attack.

Figure 5:
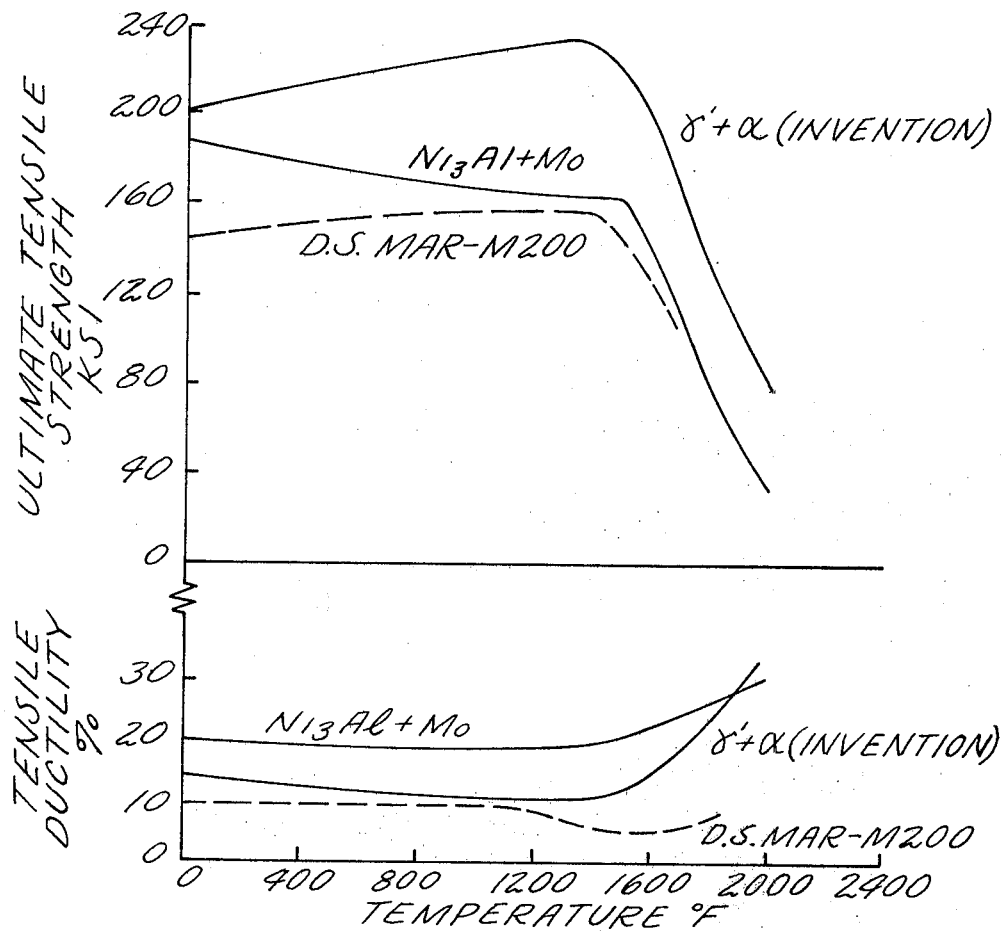
FIG. 5 shows the tensile properties of the invention alloys as a function of temperature.

FIG. 5 shows tensile properties of the articles of the present invention as a function of temperature. The curve shows both yield strength and ultimate tensile strength of the present alloy, the eutectic articles described in prior U.S. Pat. No. 4,012,241 and MAR-M-200 a conventionally nickel base superally (directionally solidified) whose composition has been given previously. The superiority of the alloy of the present invention can readily be seen.

Thus what has been described is a modified alloy article having gamma prime matrix/molybdenum fiber microstructure. The tantalum modifications provided for improved mechanical properties in combination with improved resistance to environmental degradation.

Although this invention has been shown and described with respect to a preferred embodiment thereof, it should be understood by those skilled in the art that various changes and omissions in the form and detail thereof may be made therein without departing from the spirit and scope of the invention.

Having thus described a typical embodiment of our invention, that which we claim as new and desire to secure by Letters Patent of the United States is:

1. A directionally solidified eutectic article having a composition which satisfies the following relationship:

$$12.5 \pm 0.5\% \text{ Mo}, X\% \text{ Ta}, [22 \pm 0.5 - X\%]\text{Al balance essentially Ni}.$$

where all percentages are atomic percentages, and X varies from 3.4 to 7.5,
said article having a microstructure comprising about 18 volume percent of aligned Mo fibers in a gamma prime matrix wherein from about 15.5% to about 34% of the normally occurring Al in the gamma prime matrix has been replaced by an equiatomic amount of Ta.

2. An article as in claim 1 wherein X varies from 4.1 to 7.5.

3. An article as in claim 1 which is in single crystal form and is characterized by the absence of high angle internal grain boundaries.

4. An article as in claim 1 which further contains at least one element selected from the group consisting of (by weight) up to 2% Hf, up to 0.5% Zr, up to 0.1% C, up to 0.1% B and mixtures thereof.

5. An article as in claim 4 which is in polycrystalline form, characterized by the presence of internal grain boundaries.

6. An article as in claims 1, 2, 3, 4 or 5 in which up to about one-half of the Ta content is replaced on an equiatomic basis by an element selected from the group consisting of titanium, columbium, vanadium and mixtures thereof; up to about 10% of the Mo is replaced by W on an equiatomic basis; and up to about 25% of the Ni is replaced by Co on an equiatomic basis.

7. A directionally solidified eutectic article having a microstructure consisting of about 18 volume percent of aligned Mo fibers in a gamma prime matrix consisting of about 18% Mo, about 6.8% Al, about 16.6% Ta, balance essentially nickel.

* * * * *